United States Patent
Lin (10) Patent No.: US 6,301,121 B1
(45) Date of Patent: Oct. 9, 2001

(54) DIRECT-CHIP-ATTACH (DCA) MULTIPLE CHIP MODULE (MCM) WITH REPAIR-CHIP READY SITE TO SIMPLIFY ASSEMBLING AND TESTING PROCESS

(76) Inventor: Paul T. Lin, 673 Hillcrest Ter., Fremont, CA (US) 94539

( * ) Notice: Subject to any disclaimer, the term of this patent is extended or adjusted under 35 U.S.C. 154(b) by 0 days.

(21) Appl. No.: 09/287,218

(22) Filed: Apr. 5, 1999

(51) Int. Cl.[7] ............................. H05K 7/02; H05K 7/06
(52) U.S. Cl. ..................... 361/783; 361/777; 257/48; 257/723; 438/15; 438/130
(58) Field of Search ................... 361/760, 767, 361/768, 777, 778, 783; 257/686, 723, 724, 777, 778, 48; 174/261; 324/765; 438/14, 15, 17, 128–130; 29/832, 840; 714/7, 710

(56) References Cited

U.S. PATENT DOCUMENTS

| | | | | |
|---|---|---|---|---|
| 4,992,850 | * | 2/1991 | Corbett et al. | 361/783 |
| 5,504,373 | * | 4/1996 | Oh et al. | 361/777 |
| 5,817,535 | * | 10/1998 | Akram | 438/15 |
| 5,953,216 | * | 9/1999 | Farnworth et al. | 361/777 |
| 6,008,538 | * | 12/1999 | Akram et al. | 257/723 |
| 6,087,676 | * | 7/2000 | Akram et al. | 257/723 |

* cited by examiner

Primary Examiner—Jeffrey Gaffin
Assistant Examiner—John B. Vigushin
(74) Attorney, Agent, or Firm—Bo-In Lin (57) ABSTRACT

The present invention comprises a single-substrate multiple chip module (MCM) assembly. The MCM assembly includes a repair-package-site ready MCM board having a top surface and a bottom surface, the top surface further includes a plurality of chip connection trace lines include a chip-select line. The MCM assembly further includes a plurality of bare integrated circuit (IC) chips mounted directly on the top surface of the MCM board each chip connected to the plurality of chip connection trace lines on the top surface. The repair-package-site ready MCM board further includes at least a repair-package-site disposed on the bottom surface having a plurality of connection terminals arranged according to a standard repair packaged-chip footprint. Each of the connection terminals is connected to a via connector disposed in the MCM board for electrically connecting to the conductive trace lines on the top surface. The MCM assembly further includes a chip-select jumper means for disconnecting the chip select line for one of the bare IC chips as a disconnected chip and to connect to one of the repair-package-site provided for mounting a repair packaged-chip onto the bottom surface.

12 Claims, 6 Drawing Sheets

DIRECT-CHIP-ATTACH (DCA) MULTIPLE CHIP MODULE (MCM) WITH REPAIR-CHIP READY SITE TO SIMPLIFY ASSEMBLING AND TESTING PROCESS

BACKGROUND OF THE INVENTION

1. Field of the Invention

This invention relates generally to the electronic package. More particularly, this invention relates to a novel packaging configuration by directly attaching chips on to a printed circuit board (PCB) as multiple chip module (MCM) to simplify assembling and testing processes. A new repair-chip ready site to repair a failed DCA chip of the MCM module is provided such that a simplified "package-less" packaging technology is provided where the conventional procedure of single-chip packaging and testing processes are now eliminated.

2. Description of the Prior Art

There is a challenge faced by those applying the multiple chip module (MCM) technology to package multiple electronic chips into a single module. This challenge arises from the fact that a MCM module can function properly only if every chip assembled into this MCM package is individually a good die. Also, due to the accumulative effect, even a small percentage of reject rate for the individual chips generate an unacceptable loss to the MCM packages using these chips. For example, a 99% chip acceptance rate for the individual chips, when assembled into eight-chip modules (×8 modules) as dual in-line memory module (DIMM) or single-in-line-memory module (SIMM) packages, an 8% loss or rework rate is generated which is dearly unacceptable.

Figure 1A:
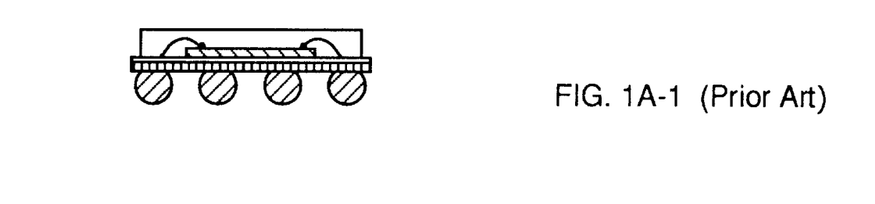
Figure 1A:
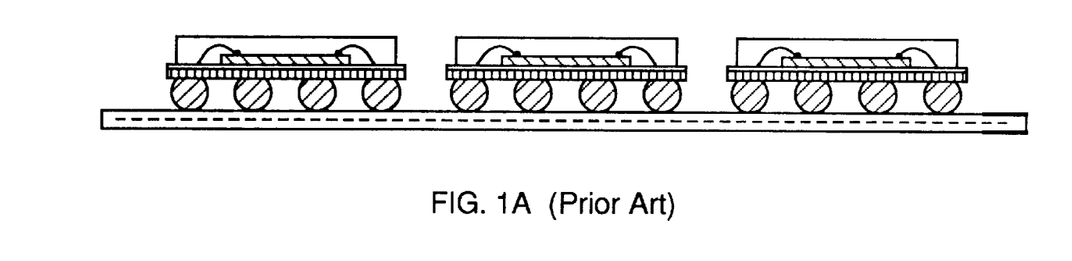
Figure 1B:
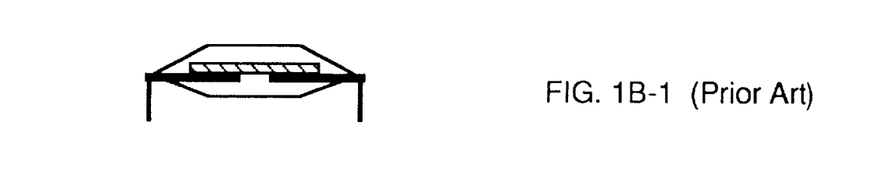
Figure 1B:
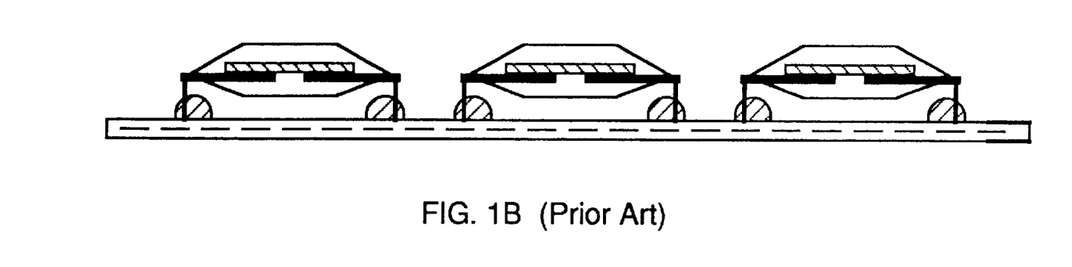

FIGS. 1A-1, 1A, 1B-1 and 1B are cross sectional views of a single chip-size-packaged (CSP) chip, and conventional multiple-chip-module assemblies implemented with multiple packaged chip-size package(CSP) and thin small out-line package (TSOP) chips mounted on lead frames respectively. Referring to FIG. 1A-1, the intergrated circuit (IC) chip is mounted on a substrate and individually packaged as a CSP packaged chip. In FIG. 1A, three of these packaged CSP of FIGS. 1A–a are mounted on a multiple-chip-module (MCM) board. Each of these packaged CSP chip must be individually burned in and tested to assure each CSP chip is a know good die (KGD) before they are mounted on the MCM borad. Similarly, in FIG. 1B-1, a TSOP chip is mounted on a lead-frame and each of the TSOP chips must also be individually tested, burned in an tested again to assure every single TSOP chip is a KGD. Then a multiple of these individually tested TSOP chips mounted on lead frames are mounted on a MCM board for assembling into a MCM module. The conventional configuration and processes of assembling the MCM module require more production times, manufacturing processes, and higher costs due to the requirement of assuring only KGD chips are used to achieve a higher production yield.

In order to reduce wastes of resources committed to packaging chips which are not good dice, burn-in tests of individual chips are performed to identify the known good dice (DGD) before a MCM packaging processes are carried out. However, the processes for burning-in each individual chip or chip-size package (CSP) are very expensive due to the requirements of special testing sockets, and large dedicated burn-in board. Furthermore, difficult handling techniques are required to test these individual chips. Due to these special and expensive requirements for qualifying an intergrated circuit (IC) chip as known good die (KGD), it generally cost more to test a chip than to test a package. For the same reasons, the price of a known good die is much higher than the untested "burned in" packaged chips. Even with the high cost of testing and a much higher price to use the KGD, due to the concern of accumulative losses when chips are assembled as multiple chip modules, there is no choice but to employ the KGDs.

As shown in FIGS. 1A and 1B, the conventional multiple-chip-module (MCM) assemblies employ a two-level configuration. A two level configuration consists of either packaged chips with a first level substrate for packaging individual chip or a lead-frame for individual chip where known good chips are required on the MCM board. The individual chips supported on the lead-frame or the first level substrate are then mounted on a multiple chip module (MCM) board. The MCM board constitutes a second level substrate used for mounting multiple of individually packaged or lead-frame-supported chips. Additional cost are incurred in this two level substrate structure since it requires more material and processing. The device performance is also adversely affected due to slower signal transmission with additional capacitance resulted from structures of more levels. This two-level structure further presents another disadvantage that the packages have a high profile. In order to enhance device miniaturization, more and more modem applications implemented with packaged electronic chips require a reduced thickness and height. Conventional MCM packages implemented with a two-level substrate structure have very limited usefulness in modern miniaturized devices when the device requires multiple IC chips to be assembled and packaged with a very high density having small assembly size and thickness.

Therefore, a need still exists in the art to provide an improved configuration and procedure for testing and packaging the multiple chip modules. In addition to cost reduction by simplifying the test processes, the new configuration must also satisfy the need to more conveniently and economically reuse the known good dice when a known good die is packaged with other failed chips into a multiple-chip-module.

SUMMARY OF THE PRESENT INVENTION

It is therefore an object of the present invention to provide an improved configuration and procedure for testing and packaging the multiple chip modules (MCMs) without being limited by using only the tested know-good-dice. The cost of testing is reduced and the failed multiple-chip module with identified failed chip or chips can be more conveniently and economically repaired in order to overcome the aforementioned difficulties and limitations encountered in the prior art.

Specifically, it is an object of the present invention to provide an improved MCM configuration and procedure for testing and packaging multiple chips as MCM assemblies. A ready repair-package-site is provided in an MCM board. A set of contact terminals arranged according to a pattern of standard repair packaged-chip footprint on the bottom surface of a printed circuit board. The repair packaged-chip can be either of JEDEC or EIAJ standard footprints. Each of the contact terminals are connected to via connector formed in the PC board for connecting to the conductive traces on the top surface. A repair packaged-chip is ready for mounting onto the connection terminal for repairing a tested and identified failed chip. Because of the ready repair site, the burn-in processes can be directly performed on each MCM at a board level such that a requirement to use the high price known good dice to avoid wastes and yield loss is eliminated.

Another object of the present invention is to provide an improved MCM configuration and procedure for testing and packaging multiple chips as MCM assemblies by employing a repair packaged-chip site ready MCM board. A plurality of contact terminals are arranged in standard footprints ready for mounting repair packaged-chips to replace identified failed chips with burn-in and functional tests conducted at board level. The requirements of complicated and time consuming rework processes to repair a failed MCM module can be significantly reduced.

Another object of the present invention is to provide an improved MCM configuration and procedure for testing and packaging multiple chips as MCM assemblies by employing a repair packaged-chip site ready MCM board. A plurality of contact terminals are arranged as standard footprints for mounting repair packaged-chips thereon with each of these contact terminals connected to conductive traces on the top surface with via connectors formed in the MCM board. A chip select jumper is provided for each chip to de-select a failed chip and in the meantime select the repair chip through the chip select jumper. Power or ground traces can be treated according to this configuration when necessary.

Another object of the present invention is to provide an improved MCM configuration and procedure for testing and packaging multiple chips as MCM assemblies by mounting multiple chips directly on a CSP-ready MCM board. Only a single level of substrate is required for majority of MCM assemblies, which pass the burn-in and functional tests such that the height of the package profile of the MCM assembly can be reduced. Performance of assembled module of this invention is also improved with reduced capacitance-delays when level-structure of the MCM is simplified.

Briefly, in a preferred embodiment, the present invention comprises a single-substrate multiple chip module (MCM) assembly. The MCM assembly includes a repair-package-site ready MCM board having a top surface and a bottom surface, the top surface further includes a plurality of chip connection trace lines include a chip-select line. The MCM assembly further includes a plurality of bare integrated circuit (IC) chips mounted directly on the top surface of the MCM board each chip connected to the plurality of chip connection trace lines on the top surface. The repair-package-site ready MCM board further includes at least a repair-package-site disposed on the bottom surface having a plurality of connection terminals arranged according to a standard repair packaged-chip footprint. Each of the connection terminals is connected to a via connector disposed in the MCM board for electrically connecting to the conductive trace lines on the top surface. The MCM assembly further includes a chip-select jumper or laser fusible traces for disconnecting the chip select line for one of the bare IC chips as a disconnected chip and to connect to one of the repair-package-site provided for mounting a repair packaged-chip onto the bottom surface.

These and other objects and advantages of the present invention will no doubt become obvious to those of ordinary skill in the art after having read the following detailed description of the preferred embodiment which is illustrated in the various drawing figures.

BRIEF DESCRIPTION OF THE DRAWINGS

FIGS. 1A-1, 1A, 1B-1 and 1B are cross sectional views of two alternate conventional MCM assemblies implemented with packaged chips with CSP packaged chips, and TSOP chips with lead frame structure;

DETAILED DESCRIPTION OF THE PREFERRED EMBODIMENT

Figure 2A:
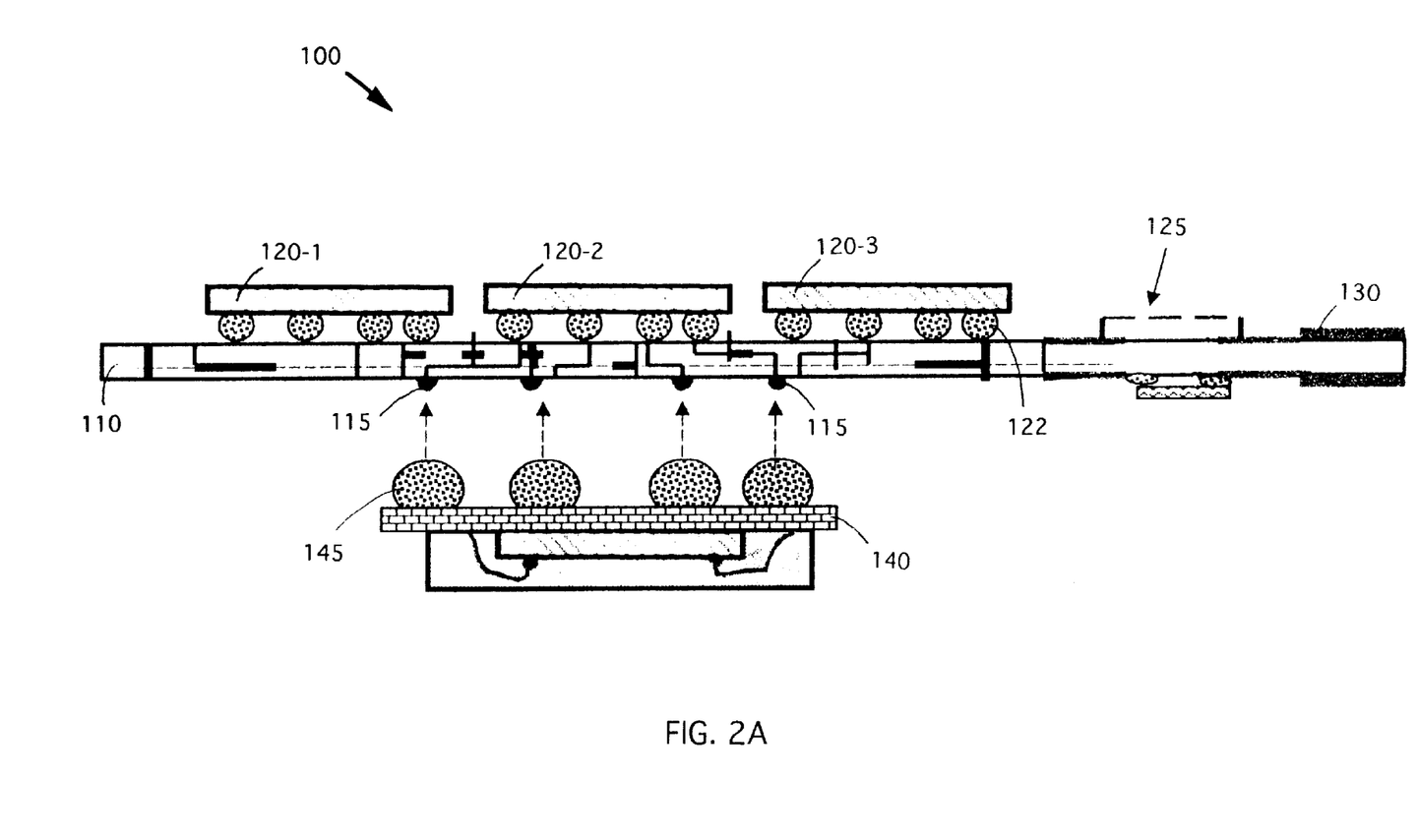
FIG. 2A shows the cross sectional view for a flip-chip multiple chip module (MCM) assembly supported on a printed circuit board provided with repair packaged-chip ready site, e.g., a footprint of a fine-pitched ball-grid-array (BGA) ready-site, of this invention.

Please refer to FIG. 2A for a cross sectional view of a multiple-chip module (MCM) 100. The MCM module 100 includes multiple flip chips, e.g., chips 120-1 to 120-3, mounted on a printed circuit board 110. The MCM module 100 implements a direct chip attachment (DCA) configuration with several flip chips 120-1 to 120-3 mounted on the printed circuit board 110. The printed circuit board 110 is provided with one or several sets of repair packaged-chip ready sites 115 on the bottom surface. A set of fine-pitched ball-grid-array ready sites is shown for illustration. Each set of the repair packaged-chip ready sites is arranged according to a pattern of a standard footprint of packaged chip, e.g., standard fine-pitched BGA packaged chip 140 as shown. The pattern of a standard footprint for a packaged chip is most likely different than the arrangement of the contact terminals 122 of the flip chips 120-1 to 120-3 mounted on the top surface of the printed circuit board 110. The packaged chip 140 is provided for mounting onto the bottom surface of the MCM board 110 for repair if necessary. The packaged chip 140, e.g., a fine-pitched BGA chip 140, typically is greater in size and have larger footprint than the bare chips 120-1 to 120-3 mounted on the top surface. With these ready-site contact terminals 140 formed on the bottom surface, the standard packaged-chip 140 can be directly mounted on the repair packaged-chip ready sites 115 for repairing the MCM assembly by replacing a chip if it fails in the MCM module tests. Each of the ready sites corresponds to a contact terminal 145 of the packaged chip, e.g., contact terminals 145 of a fine-pitched ball grid array, implemented in the standard repair packaged chip 140. The printed circuit board (PCB) 110 is a multiple layer PCB. Via holes filled with conductive material are formed through each of these layers. Conductive traces are formed on each of these layers and connected to these via connectors formed in the via holes for connecting traces between different layers of this new MCM board 110 provided with standard packaged chip ready sites 115.

The MCM module 100 further includes a plurality of interconnecting traces formed in one or several of the multiple layers of the PCB board 110 to interconnect the multiple chips 120-1 to 120-3 to a set of test edge connectors 130. The edge connectors disposed on the edge of the printed circuit board 110 are testing connectors compatible to standard testing socket. The whole MCM assembly 100 mounted with multiple bare chips 120-1 to 120-3 can be conveniently inserted into a standard testing socket for conducting a set of burning in and functionality tests. The interconnecting traces are also implemented for transmitting signals to carry out various electrical operations and tests inputted through these edge-connectors 130. Each of the repair packaged-chip ready sites is connected to a via connector through the printed circuit board to connect to a interconnecting traces disposed on one or several of the multiple layers of the printed circuit board 110.

By inserting this printed circuit board mounted with multiple bare chips 120-1 to 120-3 into a testing socket, a set of tests can be performed directly on the MCM module 100. After these tests, each one of these multiple chips 120-1 to 120-3 can be individually and then in combination with other bare chips qualified as tested and known-good dice (KGD) ready for further processing and shipment. The burn-in and functionality tests can also determine if any chip is to be rejected as a failed and known-bad-die. The edge connectors are formed with materials that can sustain high temperature for carrying out the burn-in tests. Unlike the conventional manufacture and packaging process that requires burn-in tests for each chip, the MCM module as now disclosed can be tested as a module without first testing the individual chips.

After the tests are carried out, if any of the multiple chips 120-1 to 120-3 is identified as a failed known-bad chip, a standard packaged-chip 140 is attached to the repair packaged-chip sites 115 as a repair chip to replace the failed chip. A chip select means or a jumper means 125 is provided to disable or disconnect the failed chip. A repair packaged-chip 140 with standard footprint is mounted onto the repair packaged-chip ready sites as a repair chip to replace the identified failed chip and to repair the MCM module 100.

Therefore, by mounting these flip chips 120-1 to 120-3 on this printed circuit board 110 provided with repair packaged-chip ready sites, the processes of assembling a MCM module is greatly simplified. The burn-in and testing processes can be performed directly on this MCM assembly 100. The burn-in test is carried out to determine if this MCM assembly 100, by packaging and connecting these flip chips, is a good MCM assembly. If it is, then the whole MCM assembly 100 can be shipped out as a finished product. If one or several of these flip chips are determined as unacceptable during the burn-in and testing processes, according to the conventional configuration, the MCM assembly is not useful in this MCM packaged form. However, with the repair packaged-chip ready sites, a repair packaged-chip with standard footprint can be mounted onto the repair packaged-chip ready sites to repair the MCM. The failed chip identified in the test is disabled or disconnected by the chip select or jumper means 125. As a replacement, the repair chip 140 is now select to function as part of the MCM module. Instead of transmitting electrical signals to the failed chip, by applying the chip select or jumper means 125, all the electrical signals are directed to the repair packaged-chip. The MCM 100 can now function normally even one or several of the chips are tested and identified as failed chips. The packaging and testing processes are simplified without being limited to first test and use only the known-good chips on the MCM module. Cost saving are also achieved by testing the MCM as an integrated unit instead of testing each chip as individual unit under test.

Figure 2B:
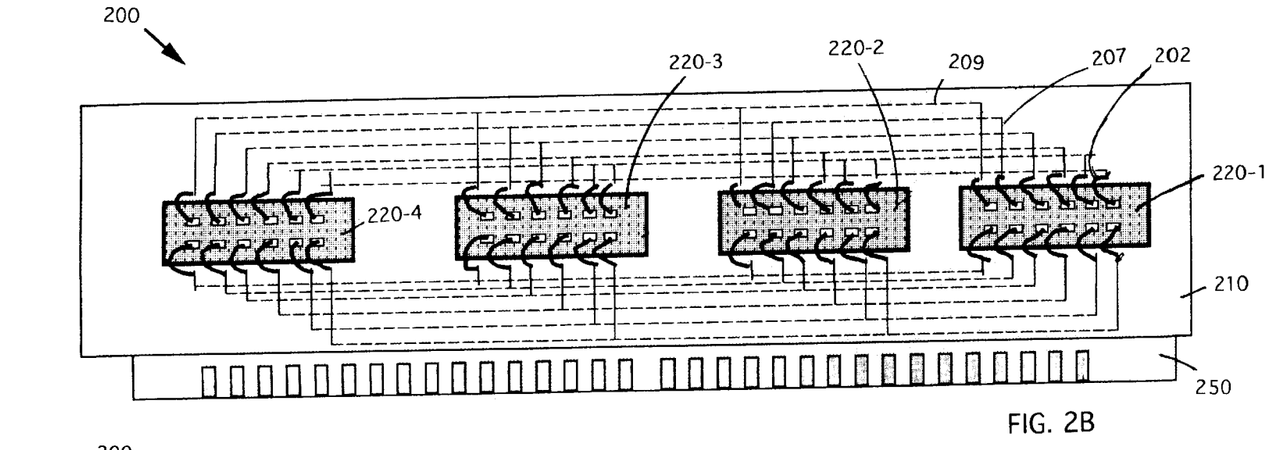
FIGS. 2B and 2C are top and bottom views of the MCM assembly of FIG. 2A.
Figure 2C:
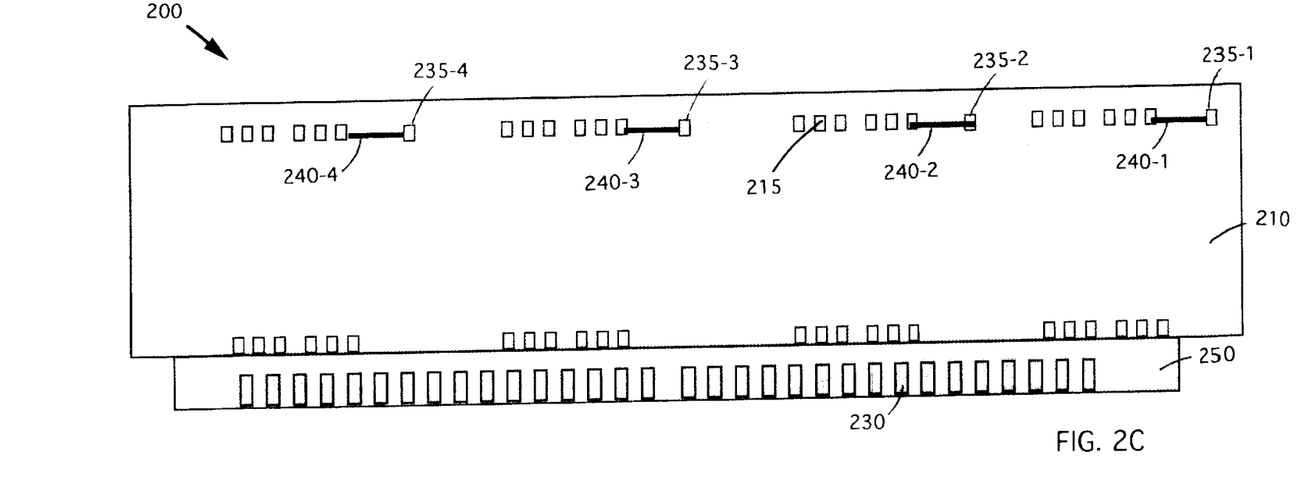

According to FIGS. 2A to 2C and the above descriptions, the present invention discloses a single-substrate multiple chip module (MCM) assembly. The MCM assembly 100 includes a repair-package-site ready MCM board 110 having a top surface and a bottom surface. The top surface further includes a plurality of chip connection trace lines include a chip-select line. The MCM module includes a plurality of bare integrated circuit (IC) chips 120-1 to 120-3 mounted directly on the top surface of the MCM board each chip connected to the plurality of chip connection trace lines on the top surface. The repair-package-site ready MCM board 110 further includes at least a repair-package-site 115 disposed on the bottom surface having a plurality of connection terminals arranged according to a standard repair packaged-chip footprint. Each of the connection terminals being connected to a via-connector disposed in the MCM board 110 for electrically connecting to the conductive trace lines on the top surface. The MCM module 100 further includes a chip-select jumper means 125 for disconnecting the chip select line for one of the bare IC chips as a disconnected chip to connect to one of the repair-package-site 115 provided for mounting a repair packaged-chip 140 onto the bottom surface. In a preferred embodiment, the single-substrate MCM assembly of further includes a repair packaged-chip 140 mounted onto the repair-package-site 115.

FIGS. 2B and 2C, show a top view and a bottom view of an alternate embodiment of another multiple chip module (MCM) 200 configured as direct die bond and chip on board wire bonding MCM module. The MCM module 200 includes four chips 220-1 to 220-4 each has a plurality of bonding wires 202 wire-bonded to bonding pads 205 disposed on the top surface of the printed circuit board 210. Each of these wire-bonding pads 205 is connected through a conductive line 207 to one of a plurality of inter-connecting traces 209 routed on the top surface of the printed circuit board (PCB) 210. One of the inter-connecting traces may be implemented to transmit a chip select signal to disable one or several chips 220-1 to 220-4. There are also a plurality of edge connectors 230 employed as testing pins for inserting into a tester socket to carry out a set of burn-in and functionality tests. The edge connector 230 formed near the edge are connected to the integrated circuit chips 220-1 to 220-4 by conductive lines supported one or several different layers of the PCB 210. Again, materials of high-melting point are used to form the edge connector testing pins 230. The edge connector 230 can therefore sustain a higher temperature required for longer-term high temperature tests.

FIG. 2C shows the bottom view of the MCM module 200. There are four sets of repair packaged-chip ready sites 215. These repair packaged-chip ready sites 215 are arranged to have standard packaged-chip footprints, e.g. TSOP footprints, which are different from and typically larger than the footprint of the multiple chips 220-1 to 220-4 mounted on top of the MCM board 210. One of the ready-sites 215 is connected to a chip select terminal 235-1 to 235-4 by a jumper connector 240-1 to 240-4. Under the circumstance one of the chips 220-1 to 220-4, e.g., chip 220-2, is tested and identified as a failed chip, a repair packaged chip, e.g., a TSOP chip, is mounted on the bottom surface of the board 210 to function as a repair chip. The repair chip is mounted onto the set of ready sites arranged as standard TSOP footprint connected through the jumper line 240-2 to replace chip 220-2, i.e., the failure chip. And, the jumper connectors 240-1, 240-3, and 240-4 are disconnected. Only the second set of ready-sites arranged as standard TSOP footprint are selected perform electrical functions to replace the failure chip 220-2 while all other ready-sites not selected are now disabled by breaking the jumper connector 240-1, 240-3, and 240-4. Since the standard packaged chips are commonly available in the market, a simple and practical configuration is provided to repair a failure chip by simply mounting a standard packaged-chip as a replacement. The requirement for removing a failure chip from the MCM assembly to rework the chip and to replace the failure chip is no longer necessary. Significant cost savings are achieved by skipping the steps of first packaging and testing each chip individually. Bare chips 220-1 to 220-4 are mounted directly onto the printed circuit board 210 without requiring packaging and testing to assure each chip is a known good die. The MCM assembly as an integral module is ready for performing the burn-in and various functionality tests. Once the tests are completed, all the chips that fail the tests are now conveniently repaired by mounting a replacement chip onto the bottom surface. The bottom surface is provided with ready-sites arranged in standard footprints. Jumper connectors are also made available to selectively connect to chip select lines for enabling the replacement chip and disabling the failure chip now replaced by the repair chip mounted on the bottom surface.

Again, by mounting these wire-bonding chips 220-1 to 220-4 on this repair-sites ready MCM board 210, the burn-in and testing processes can be performed directly on this MCM assembly 200 to determine if this MCM assembly 200, by packaging and connecting these wire-bonding chips, is a good MCM assembly. If it is, then the whole MCM assembly 200 can be shipped out as a finished product. If one or several of these wire-bonded chips are determined as unacceptable during the burn-in and testing processes, the MCM assembly is not useful in this MCM packaged form. However, the MCM module is conveniently repairable by mounting a replacement chip for each of the failure chips. The replacement is enabled by employing a jumper connector connected to a chip select line while the failure chip is disabled by employing either a jumper means or an appropriate chip select signal.

Figure 3A:
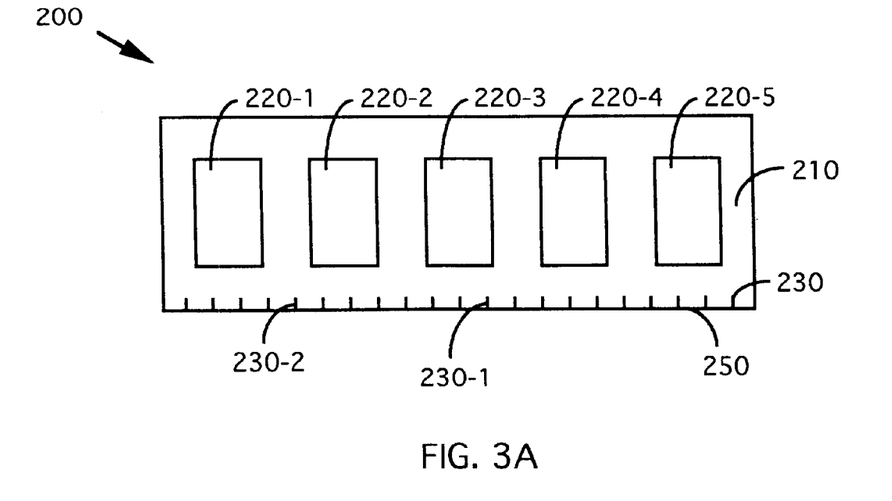
FIGS. 3A to 3C show a cross sectional, a top and a bottom views respectively for a wire-bond MCM assembly provided with repair packaged-chip ready sites, e.g., TSOP packaged-chip ready-sites, on the bottom surface and edge connectors for conducting the burn-in and functionality tests directly on the MCM module.
Figure 3B:
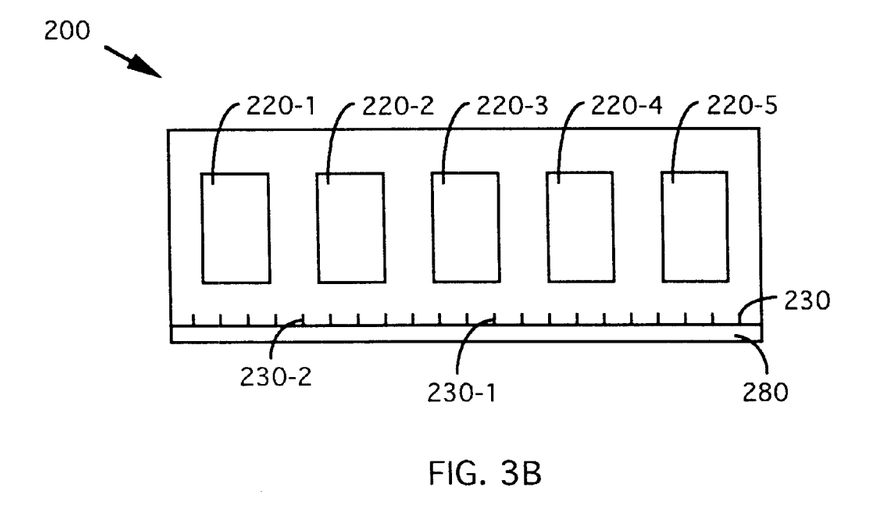
Figure 3C:
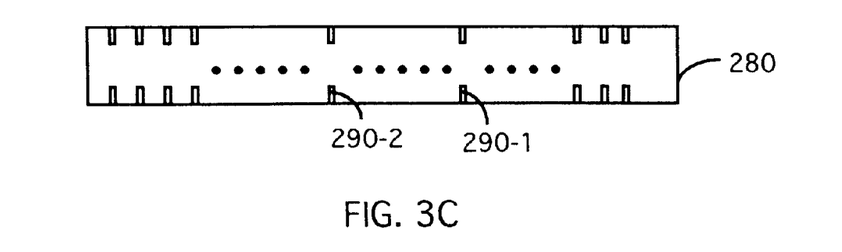

Referring to FIGS. 2B and 2C again for the plurality of test pins 230 disposed on a testing insertion edge 250. There are multiple chips 220-1 to 240-4 mounted on this MCM board 210 and a plurality of conductive traces (not shown) connecting the chip connection terminals disposed on the board to the testing pins 230. There are two kinds of test pins among the test pins 230. The first kind of test pins 230-1 are burn-in test pins for connecting to a set of burn-in socket receptors disposed in a standard socket (see FIG. 3C) for conducting a burn-in test. The second kind of test pins 230-2 are board-level test pins for connecting to a set of board-level socket receptors disposed in the standard socket shown in FIG. 3A for conducting a board-level test. Unlike the testing procedures employed in the conventional MCM assembly, the burn-in tests and the board-level tests for the MCM assembly 200 are now carried out directly on the board and using a single standard testing socket as that shown in FIG. 3B below. The procedures are much simplified compared to the conventional processes where the burn-in tests are performed for each individual chip by using special sockets which can endure higher temperatures used for burn-in tests, then the boardlevel tests are applied when all the chips are mounted on the MCM board. Referring to FIG. 3C, the MCM board 210 is inserted into a standard testing socket 280 for performing a burn-in test and a board level test. The standard burn-in and board-level testing socket 280 is made of materials with high melting point and can sustain a burn-in test temperature ranging from 100 to 150° C. This standard burn-in and board-level testing socket 280 includes two types of socket receptors 290-1 namely the burn-in socket receptors 290-2 and board-level socket receptors 290-2, for receiving the burn-in test pins 230-1 and the board-level test pins 230-2 respectively. Again, the testing socket 280 is also novel from a conventional board-level test socket. The conventional board-level test sockets are only provided with board level test socket adapters to receive board level test pins. In contrast, the burn-in and board-level testing socket 280 includes a set of socket adapters 290-1 to receive a set of burn-in test pins 230-1 and another set of socket adapters 290-2 to receive a set of board level test pins 230-2. Furthermore, the burn-in and board-level test socket 280 are made with material to sustain a higher burn-in test temperature which is not required in a conventional MCM board test socket.

Figure 4A:
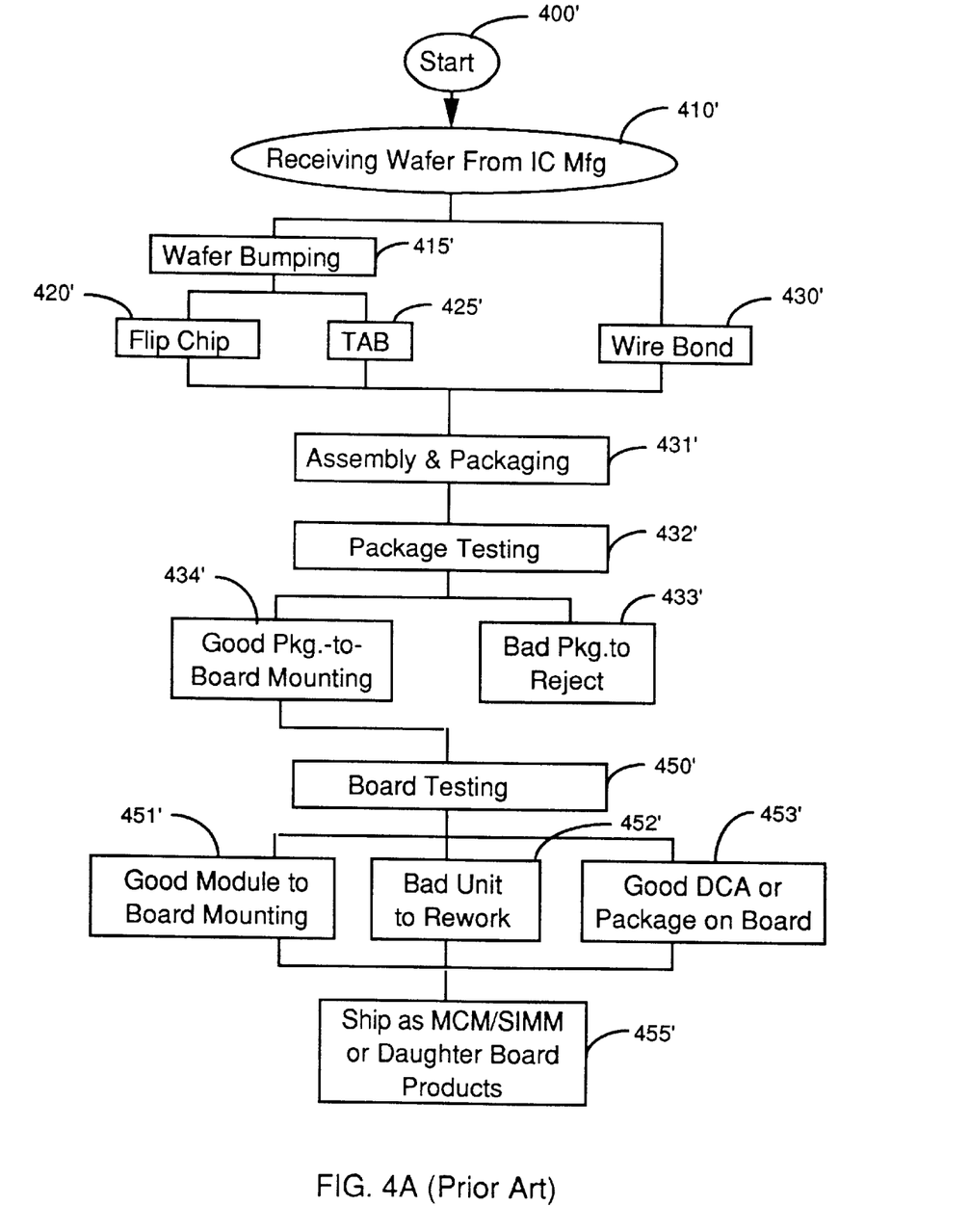
FIGS. 4A and 4B are flowcharts for comparing the manufacture processes of a conventional MCM assembly shown in FIGS. 1A and 1B versus that of a MCM assembly of this invention.

By employing a repair-chip ready-sites MCM board and conducting the burn-in and board level tests directly with the multiple chips mounted on the board as described above, the process flow is significantly simplified. A comparison of these different process flows used by a conventional MCM technique and that of a reusable CSP/MCM are listed in FIG. 4A and 4B respectively as two flow charts in parallel. The flow charts illustrate the processing steps at different stages including a wafer stage, a chip package stage, a chip package testing stage, a board testing stage, and a final shipment/rework/reject stage. In FIG. 4A, the processes begin (step 400') by receiving the wafer from front-end integrated circuit manufacture facility (step 410'). A wafer-bumping step is carried out (step 415') followed by a flip chip (step 420') or TAB bumping (step 425') processes to complete the wafer level preparation works. Otherwise, if it is a wire bond type of chips, a wire bonding process (step 430') is carried out. An assembly and packaging process is performed (step 431') followed by a package testing (step 432') which generally include the burn-in tests for the packaged chips to assure good dice are identified for further multiple chip mounting and testing processes. Bad packages of individual IC chips are identified and rejected (step 433'). The good packages are selected for board mounting (step 434'). A board level testing process is performed (step 450') to identify the MCM assembly which has all good chip packages on board (step 451') and ready for shipment (step 455'). Or, good units direct chip attachment are performed to replace the identified bad units (step 453') or the bad units identified are reworked (step 452') to obtain a completely acceptable MCM assembly for shipment (step 455').

Figure 4B:
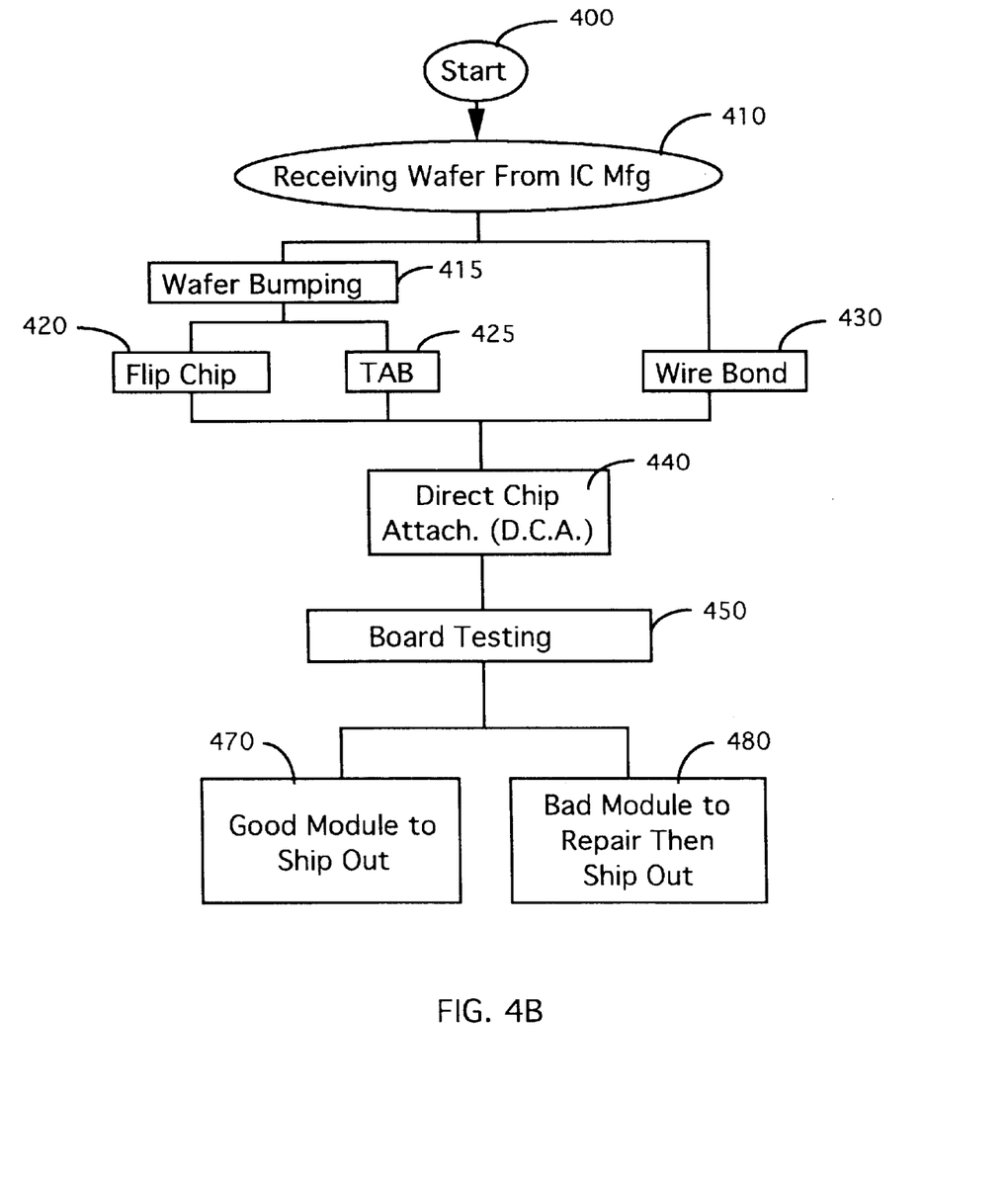

Comparing to the conventional method, FIG. 4B shows a much more simplified processing flow. After the wafer-level works in steps 400 and steps 435 are completed, the individual chips are directly mounted to a repair-chip ready-site MCM board of this invention by a direct chip attachment method (step 440). A combined burn-in and board level testing process is performed (step 450). If there are bad chips identified, the identified known bad chips can be replaced by a back-side replacement chip attachment method as that described above to repair the MCM assembly for shipment as a good package (step 470).

Therefore, the present invention provides an improved configuration and procedure for testing and packaging the multiple chip modules (MCMs) without being limited by using only the tested know-good-dice. The cost of testing is reduced and the failed multiple-chip module with identified failed chip or chips can be more conveniently and economically repaired to overcome the difficulties and limitations encountered in the prior art. Specifically, a ready repair-chip ready-site is provided for an MCM board by providing a set of contact terminals arranged according to a pattern of standard repair packaged-chip footprint on the bottom surface of a printed circuit board. Each of the contact terminals is connected to via connector formed in the printed circuit board for connecting to the conductive traces and to corresponding contact terminals on the top surface. A repair packaged-chip is ready for mounting onto the connection terminal for repairing a tested and identified failed chip. Because of the ready repair sites, the burn-in processes can be directly performed on each MCM at a board level such that a requirement to use the high price known good dice to avoid wastes and yield loss is eliminated. Thus, the requirements of complicated and time consuming rework processes to repair a failed MCM module can be significantly reduced. A chip select jumper is provided for each chip to de-select a failed chip and in the meantime select the repair chip through the chip select jumper. Furthermore, only a single level of substrate is required for majority of MCM assemblies that pass the burn-in and functional tests such that the height of the package profile of the MCM assembly can be reduced.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A single-substrate multiple chip module (MCM) assembly comprising:

a repair-chip ready-site MCM board having a top surface and a bottom surface, said top surface further including a plurality of interconnecting traces include a chip-select line;

a plurality of bare integrated circuit (IC) chips mounted directly on said top surface of said MCM board each chip connected to said plurality of interconnecting traces on said top surface;

said repair-chip ready-site MCM board further includes a plurality of repair-chip ready-sites disposed on said bottom surface each corresponding to one of said bare IC chips and having a plurality of connection terminals arranged according to a standard packaged chip footprint of said bare IC chips, said packaged-chip footprint corresponding to and slightly larger than a footprint of said bare IC chips wherein each of said connection terminals being connected to a via connector disposed in said MCM board for electrically connecting to said interconnecting traces on said top surface; and a chip-select jumper means for severing and disconnecting said chip select line to each one of said bare IC chips as a failed and disconnected chip while maintaining a connection from said chip select line to said connection terminals of said corresponding repair-chip ready-site provided for mounting a repair-chip onto said bottom surface.

2. The MCM assembly of claim 1 further comprising:

a standard packaged chip of said bare IC chips mounted onto said corresponding repair-chip ready-site as said repair chip for said failed and disconnected chip.

3. The MCM assembly of claim 1 wherein: p1 each of said repair-chip ready-sites having a footprint for mounting a standard fine-pitched ball grid array (BGA) packaged-chip.

4. The MCM assembly of claim 1 wherein:

each of said repair-chip ready-sites having a footprint for mounting a standard TSOP packaged-chip.

5. The MCM assembly of claim 3 further comprising:

a fine-pitched BGA packaged chip mounted onto said corresponding repair-chip ready-site as said repair chip for replacing said failed and disconnected chip.

6. The MCM assembly of claim 4 further comprising:

a TSOP packaged-chip mounted onto said corresponding repair-chip ready-site as said repair chip for replacing said failed and disconnected chip.

7. A method of manufacturing a single-substrate multiple chip module (MCM) assembly comprising:

a) providing a repair-chip ready-site MCM board with a top surface and a bottom surface and forming a plurality of interconnecting traces including one chip-select line on said top surface;

b) mounting a plurality of bare integrated circuit (IC) chips directly on said top surface of said MCM board and connecting each chip to said plurality of interconnecting traces on said top surface;

c) forming on said bottom surface of said repair-package-site ready MCM board a plurality of repair-chip ready-sites each corresponding to one of said bare IC chips by forming a plurality of connection terminals arranged according to a standard packaged chip footprint of said bare IC chips corresponding to and slightly larger than a footprint of said bare IC chips and connecting each of said connection terminals to a via connector disposed in said MCM board to electrically connect to said interconnecting traces on said top surface; and d) disconnecting by severing a chip-select jumper means to disconnect said chip select line from one of said bare IC chips as a failed and disconnected chip while maintaining a connection from said chip select line to said connection terminals one of said corresponding repair-chip ready-site provided for mounting a repair-chip onto said bottom surface.

8. The method of claim 7 further comprising:

e) mounting a standard packaged chip of said bare IC chips as a repair-chip onto said corresponding repair-chip ready-site for replacing said failed and disconnected chip.

9. The method of claim 7 wherein:

said step c) of forming on said bottom surface a plurality of repair-chip ready-sites is a step of forming on said bottom surface a plurality of repair-chip ready sites each having a footprint for mounting a standard fine-pitched ball grid array (BGA) packaged-chip.

10. The method of claim 7 wherein:

said step c) of forming on said bottom surface a plurality of repair-chip ready-sites is a step of forming on said bottom surface a plurality of repair-chip ready sites each having a footprint for mounting a standard TSOP packaged-chip.

11. The method of claim 9 further comprising:

mounting on said bottom surface a fine-pitched BGA packaged chip onto said corresponding repair-chip ready-site as said repair chip for replacing said failed and disconnected chip.

12. The method of claim 10 further comprising:

mounting on said bottom surface a TSOP packaged-chip onto said corresponding repair-chip ready-site as said repair chip for replacing said failed and disconnected chip.

* * * * *